(12) United States Patent
Lloyd et al.

(10) Patent No.: US 9,368,550 B2
(45) Date of Patent: Jun. 14, 2016

(54) APPLICATION SPECIFIC INTEGRATED CIRCUIT WITH INTEGRATED MAGNETIC SENSOR

(71) Applicant: INVENSENSE, INC., San Jose, CA (US)

(72) Inventors: Stephen Lloyd, Los Altos, CA (US); Jong Il Shin, San Jose, CA (US); Jongwoo Shin, Pleasanton, CA (US)

(73) Assignee: Invensense, Inc., San Jose, CA (US)

( * ) Notice: Subject to any disclaimer, the term of this patent is extended or adjusted under 35 U.S.C. 154(b) by 0 days.

(21) Appl. No.: 14/326,926

(22) Filed: Jul. 9, 2014

(65) Prior Publication Data

US 2015/0021727 A1 Jan. 22, 2015

Related U.S. Application Data

(63) Continuation-in-part of application No. 14/149,779, filed on Jan. 7, 2014.

(60) Provisional application No. 61/856,560, filed on Jul. 19, 2013.

(51) Int. Cl.
| | |
|---|---|
| *H01L 27/22* | (2006.01) |
| *H01L 43/12* | (2006.01) |
| *G01R 33/038* | (2006.01) |
| *G01R 33/09* | (2006.01) |
| *G01R 33/12* | (2006.01) |
| *H01L 43/08* | (2006.01) |

(52) U.S. Cl.
CPC ............ *H01L 27/222* (2013.01); *G01R 33/038* (2013.01); *G01R 33/093* (2013.01); *G01R 33/1207* (2013.01); *H01L 27/226* (2013.01); *H01L 43/08* (2013.01); *H01L 43/12* (2013.01)

(58) Field of Classification Search
CPC ....... H01L 27/222; H01L 43/12; H01L 43/08; G11C 11/15
See application file for complete search history.

(56) References Cited

U.S. PATENT DOCUMENTS

| | | | |
|---|---|---|---|
| 5,843,589 | A | 12/1998 | Hoshiya et al. |
| 2001/0015878 | A1 | 8/2001 | Varga et al. |
| 2003/0011944 | A1 | 1/2003 | Hosomi |
| 2004/0014243 | A1 | 1/2004 | Drewes |
| 2004/0213043 | A1* | 10/2004 | Tuttle et al. .................. 365/173 |
| 2010/0276389 | A1* | 11/2010 | Mather et al. .................. 216/22 |
| 2012/0012956 | A1 | 1/2012 | Saitoh et al. |

OTHER PUBLICATIONS

PCT International Search Report PCT/US2014/047322 Dated Nov. 12, 2014 (2 pages).
PCT International Written Opinion PCT/US2014/047322 Dated Nov. 12, 2014 (3 pages).

* cited by examiner

*Primary Examiner* — Tucker J Wright
(74) *Attorney, Agent, or Firm* — Minisandram Law Firm; Raghunath S. Minisandram (57) ABSTRACT

A method and system for a device with a magnetic sensor element and magnetic storage elements is disclosed. The device includes an integrated circuit substrate. At least a magnetic sensor with a magnetic sensor element with a permanent magnet is disposed over the integrated circuit substrate. A plurality of magnetic storage elements, each with at least one permanent magnet is disposed over the integrated circuit substrate.

51 Claims, 8 Drawing Sheets

APPLICATION SPECIFIC INTEGRATED CIRCUIT WITH INTEGRATED MAGNETIC SENSOR

TECHNICAL FIELD

This application claims priority to U.S. provisional patent application No. 61/856560 filed on Jul. 19, 2013, entitled "Application Specific Integrated Circuit (ASIC) With Integrated Compass", which is incorporated herein by reference, in its entirety. This application is a continuation-in-part of U.S. patent application Ser. No. 14/149,779, filed on Jan. 7, 2014, entitled "Magnetic sensors with permanent magnets magnetized in different directions". This application also claims priority to U.S. patent application Ser. No. 14/149,779, filed on Jan. 7, 2014, which is incorporated herein by reference, in its entirety.

TECHNICAL FIELD

The present invention relates generally to magnetic sensors and more specifically magnetic sensors with memory storage devices.

DESCRIPTION OF RELATED ART

Magnetic sensors may be formed in semiconductor devices. Magnetic sensors may include one or more permanent magnets. Magnetic sensors may communicate with a motion processing unit. Motion processing unit may include a processor and a memory storage device to store or retrieve temporary or permanent data. Components of motion processing unit may be formed as application specific integrated circuit. It may be beneficial to fabricate additional components as part of the application specific integrated circuit.

With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a device with a magnetic sensor element and a plurality of magnetic storage elements is disclosed. The device includes an integrated circuit substrate. A magnetic sensor with at least one magnetic sensor elements including a permanent magnet is disposed over the integrated circuit substrate. A plurality of magnetic storage elements, each with at least one permanent magnet is disposed over the integrated circuit substrate.

In yet another embodiment, a method for providing a device is disclosed. The method includes providing an integrated circuit substrate. A magnetic sensor with at least one magnetic sensor element with a permanent magnet is disposed over the integrated circuit substrate. A plurality of magnetic storage elements, each with at least one permanent magnet is disposed over the integrated circuit element.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following Figures.

DETAILED DESCRIPTION

To facilitate an understanding of the adaptive aspects of the present disclosure, an exemplary host device with an exemplary motion processing unit of this disclosure is described. The specific construction and operation of the adaptive aspects of the magnetic sensor with magnetic storage device of the present disclosure are described with reference to the exemplary motion processing unit.

Figure 1:
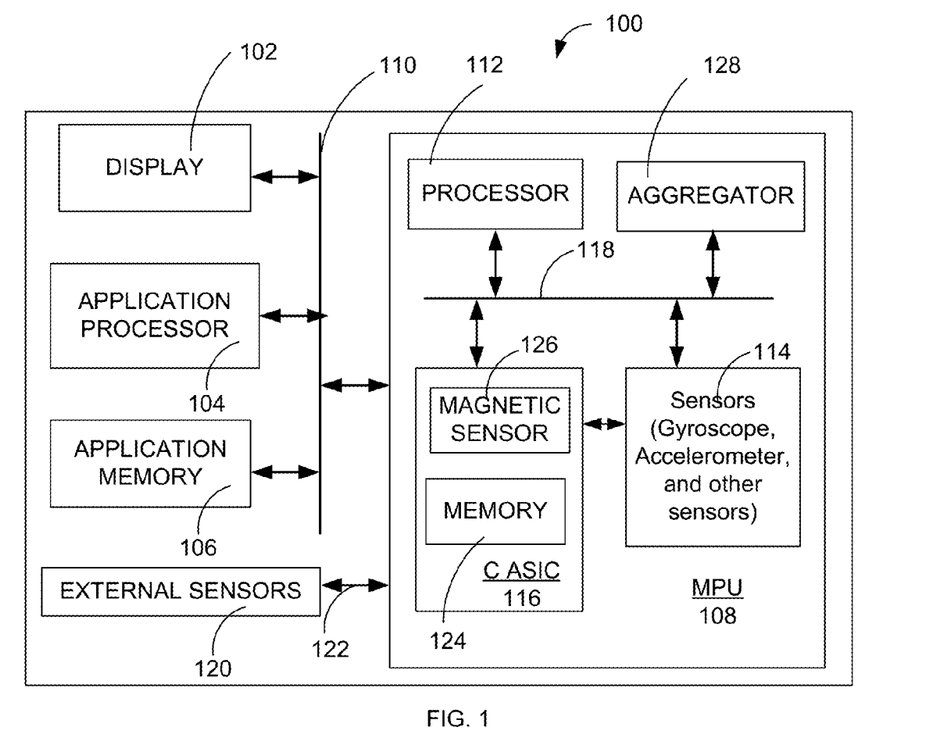
FIG. 1 shows an example host device, according to one aspect of the present disclosure.

Now, referring to FIG. 1, an example host device 100 is described. The host device 100 includes a display 102, an application processor 104, application memory 106 and a motion processing unit 108 (sometimes referred to as MPU), all communicating over a host bus 110.

MPU 108 includes a processor 112, one or more sensors 114, a composite application specific integrated circuit 116

(sometimes referred to as a composite ASIC), all communicating with each other over a MPU bus 118. One or more external sensors 120 may communicate with the MPU 108 over link 122. MPU bus 118 may be configured to transmit both analog and digital signals. Composite ASIC 116 of this disclosure may include a memory 124 and a magnetic sensor 126, functions and features of which will be later described in detail. Portions of memory 124 may be used to store permanent and transient values generated during the operation of the MPU 108. For example, information related to sensors, orientation information, signals generated during the operation, time stamp of various operations performed and the like may be stored in a portion of memory 124.

In some examples, MPU 408 act as a hub to collect information from various sensors and present an aggregated information to the application processor 104 over bus 110. For example, an aggregator 128 may aggregate information from various sensors and present an aggregated information to the application processor 104. In some examples, one or more functional modules may be implemented to perform aggregation of various information from the sensors. As one skilled in the art appreciates, these functional modules may be implemented as a hardware, software or a combination of hardware and software modules.

In some examples, one or more of these functional modules may be implemented as a software functions stored in the memory 124, which is executed by the processor 112. In some examples, some of these functional modules may be implemented as software functions stored in the application memory 106, which is executed by the application processor 104. Results of these functions may be reported back to the MPU 108.

In one example, the MPU 108 is configured to communicate information related to orientation of the host device 100 to the application processor 104, over bus 110. The information related to orientation of the host device may be stored in the application memory 106. The stored information related to orientation may be used by one or more applications running on the host device to manipulate or change information displayed on the display 102. In some examples, the information related to orientation may indicate a gesture, based upon a change in the information related to orientation over time. In some examples, the information related to orientation may indicate a movement with reference to a fixed location.

Figure 1A:
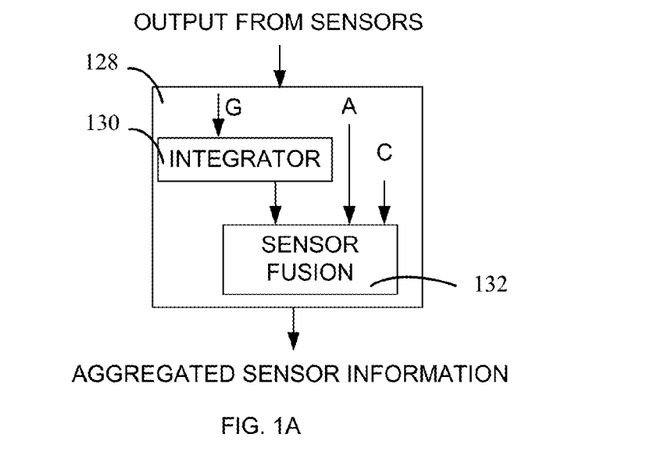
FIG. 1A shows an example aggregator, according to one aspect of the present disclosure.

Now, referring to FIG. 1B, an example aggregator 128 is described. The aggregator 128 may include an integrator module 130 and a sensor fusion module 132. As previously described, sensors may include one or more of gyroscope, accelerometer pressure sensor, microphone, light sensor, infrared sensor, temperature sensor, particle sensor, touch sensor, ultrasonic sensor, and compass. In some examples, the magnetic sensor 126 may be configured as a compass. Output of a gyroscope is fed to the integrator module 130. Output of the integrator module 130 (which is indicative of the output of gyroscope) and output of accelerometer and compass are fed as input to the sensor fusion module 132. An aggregated sensor information is generated as an output of the sensor fusion module 134. In some examples, the aggregated sensor information may correspond to a signal indicative of the orientation of the device with reference to a reference axis. In some examples, the reference axis may correspond to an axis that corresponds to gravitational force of the earth. As one skilled in the art appreciates, one or more of these functional modules may be implemented as a software functions stored in the memory 124, which is executed by the processor 112. In some examples, some of these functional modules may be implemented as software functions stored in the application memory 106, which is executed by the application processor 104. Results of these functions may be reported back to the MPU 108.

Now, with reference to FIG. 2, an example magnetic sensor 126 will be described. The magnetic sensor 126 includes one or more magnetic sensor elements 202, 204, 206 and 208. The magnetic sensor elements 202, 204, 206 and 208 are configured such that a resistance of the magnetic sensor elements change due to an external magnetic field. The change in the resistance of the magnetic sensor elements are based on the direction and extent of the external magnetic field. In one example, the external magnetic field may be earth's magnetic field. Each magnetic sensor element may be coupled to a voltage source and a switching element, like a transistor. Based on the external magnetic field applied to the magnetic sensor element, a current flowing through the magnetic sensor element will vary.

In some examples, magnetic sensor elements may include a pinned layer or a permanent magnet oriented in a given directions. In this disclosure, pinned layer and permanent magnets are used interchangeably. Magnetic sensor elements with pinned layer in some examples may be a giant magneto-resistive sensor (or sometimes referred to as a GMR sensor). GMR sensors include two magnetic layers with a conductive layer disposed in between the two magnetic layers. In some examples, one of the magnetic later may be a pinned layer. In some other examples, the magnetic sensor elements with pinned layer may be a magnetic tunnel junction elements (sometimes referred to as MTJ elements). Construction and operation of MTJ elements will be described later. Selectively configuring the magnetic sensor elements and measuring a change in the current flow can help determine the direction of an applied external magnetic field. This will be explained further now.

Magnetic sensor elements 202, 204, 206 and 208 may respectively include permanent magnets 202', 204', 206' and 208'. In one example, permanent magnets 202' and 206' of magnetic sensor elements 202 and 206 are oriented along a X axis. The orientation of the permanent magnets 202' and 206' are shown by arrows 210 and 214. Permanent magnets 204' and 206' of magnetic sensor elements 204 and 208 are oriented along an axis orthogonal to X axis, for example, Y axis. The orientation of the permanent magnets 204' and 208' are shown by arrows 212 and 216. An external magnetic field applied along an axis perpendicular to the orientation of the permanent magnet yields most amount of resistance change. For example, a magnetic field applied parallel to the orientation of the permanent magnet presents maximum resistance for flow of current in the direction of the orientation of the permanent magnet. And, a magnetic field applied perpendicular to the orientation of the permanent magnet presents least resistance for flow of current in the direction of the orientation of the permanent magnet.

Therefore, the arrangement of orientation of permanent magnets of magnetic sensor elements 202, 204, 206 and 208 can detect orientation of the sensor with reference to an external magnetic field of a known direction, for example, earth's magnetic field. For example, each magnetic sensor element may represent a resistor in a resistor bridge configured as a Wheatstone bridge to measure the current flowing through the bridge based on external magnetic field.

As one skilled in the art appreciates, the orientation of permanent magnets in magnetic sensor elements 202 and 206 are opposite to each other, as shown by the arrows 210 and 214. Similarly, the orientation of permanent magnets in magnetic sensor elements 204 and 208 are opposite to each other, as shown by the arrows 212 and 216. As one skilled in the art appreciates, this configuration permits the detection of the direction of the external magnetic field, along X axis and Y axis. Now, referring to FIG. 2A, an example construction of a magnetic sensor 126 which can also detect magnetic field applied in Z axis, which is perpendicular to X axis and Y axis is described.

Figure 2:
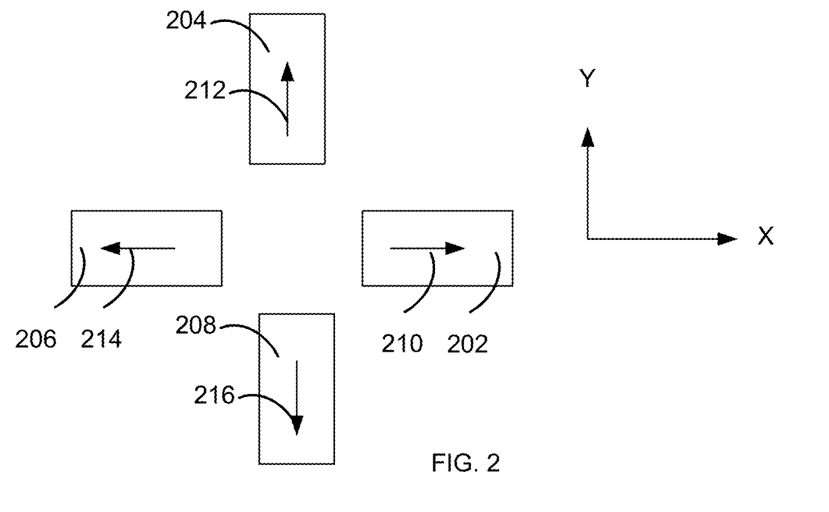
FIG. 2 shows an example magnetic sensor, according to one aspect of the present disclosure.
Figure 2A:
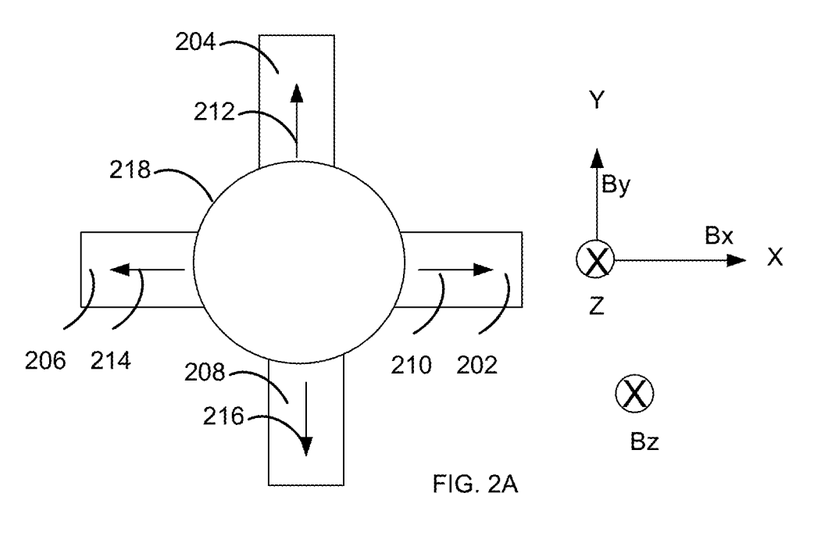
FIG. 2A shows another example construction of magnetic sensor, according to one aspect of the present disclosure.

Now, referring to FIG. 2A, an example construction of magnetic sensor 126 which can also detect magnetic field applied in Z axis is described. The construction of the magnetic sensor 126 is similar to the construction as described with reference to FIG. 2. In this example, a magnetic concentrator 218 is operatively disposed over the magnetic sensor elements 202, 204, 206 and 208 such that a magnetic field Bz applied in the Z axis will be bent by the magnetic concentrator 218 so as to provide a portion of the applied magnetic field Bz in both the X axis and Y axis. The magnetic sensor elements 202 and 206 measure both the applied magnetic field in X axis and Z axis. Similarly, magnetic sensor elements 204 and 208 measure both the applied magnetic field in Y axis and Z axis. By resolving the measured values by magnetic elements 202, 204, 206 and 208, magnetic field applied in Z direction is measured.

Figure 2B:
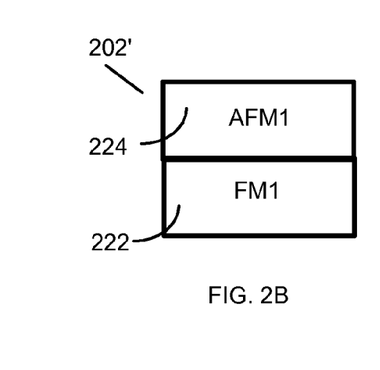
FIG. 2B shows an example construction of a permanent magnet of one of the magnetic sensor elements of FIG. 2, according to one aspect of the present disclosure.

Although magnetic sensor 126 is described as a two axis sensor with reference to FIG. 2 and as a three axis sensor with reference to FIG. 2A, as one skilled in the art appreciates, a magnetic sensor 126 may be configured with only one magnetic sensor element, for example, to measure presence or absence of an external magnetic field. Now, referring to FIG. 2B, one example construction of permanent magnets 202' and 204' of magnetic sensor elements 202 and 204 will be described. Later, another example construction of magnetic sensor elements as a magnetic tunnel junction (MTJ) element will be described with reference to FIG. 3B. FIG. 2B shows permanent magnet 202' of magnetic sensor element 202. Permanent magnet 202' has at least one ferromagnetic layer FM1 222 and one antiferromagnetic layer AFM1 224. Ferromagnetic layer may be sometimes referred to as FM layer. Antiferromagnetic layer may be sometimes referred to as AFM layer.

Figure 2C:
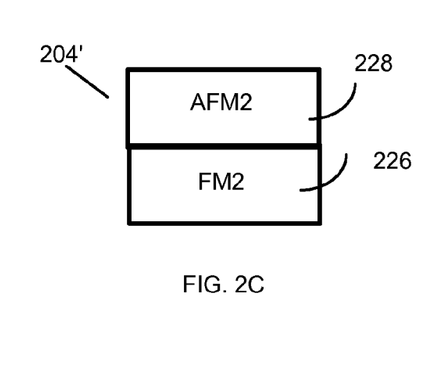
FIG. 2C shows example construction of a permanent magnet of another one of the magnetic sensor elements of FIG. 2, according to one aspect of the present disclosure.

FIG. 2C shows permanent magnet 204' of magnetic sensor element 204. Permanent magnet 204' has at least one ferromagnetic layer FM2 226 and antiferromagnetic layer AFM2 228.

A temperature at or above which an antiferromagnetic layer loses its ability to pin the magnetization direction of an adjacent ferromagnetic layer is called blocking temperature (Tblock) of that AFM layer. Magnetization direction of AFM/FM magnet is not changed when an external field is first applied and then removed at a temperature lower than the blocking temperature. In one example, the blocking temperature of the AFM1 224 layer of permanent magnet 202' of magnetic sensor element 202 is different than the blocking temperature of the AFM2 228 layer of permanent magnet 204' of magnetic element 204. In one example, the blocking temperature Ta of the AFM1 224 layer is higher than the blocking temperature Tb of the AFM2 228 layer.

Figure 2D:
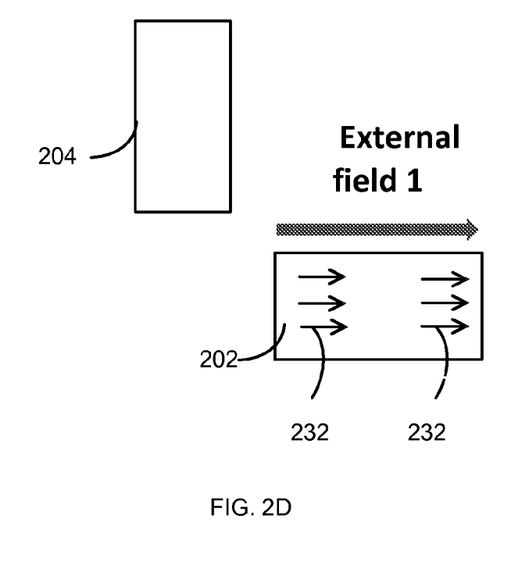
FIG. 2D shows magnetic orientation of permanent magnet of one of the magnetic sensor element, after application of magnetic field in a first direction, according to one aspect of the present disclosure.

Now, referring to FIGS. 2D and 2E, an example orientation of permanent magnets of magnetic elements 202 and 204 will be described. Referring now to FIG. 2D, magnetic sensor element 202 with arrows 232 showing the magnetic orientation of permanent magnet 202' in a first direction is shown. As an example, alternating layers of FM1 and AFM1 films are deposited to form the permanent magnet 202' of magnetic sensor element 202. The blocking temperature of the AFM1 layer is Ta. A first external magnetic field (External field 1) is applied in the desired direction of orientation for the permanent magnet 202', after raising the temperature of the films above the blocking temperature Ta for the AFM layer. After application of the first external magnetic field, the temperature is lowered below the blocking temperature Ta. Now, the permanent magnet 202' of magnetic sensor element 202 is magnetized in a first direction that corresponds to the direction of the applied magnetic field. In one example, the magnetic orientation of permanent magnet 202' of magnetic sensor element 202 corresponds to x axis.

Figure 2E:
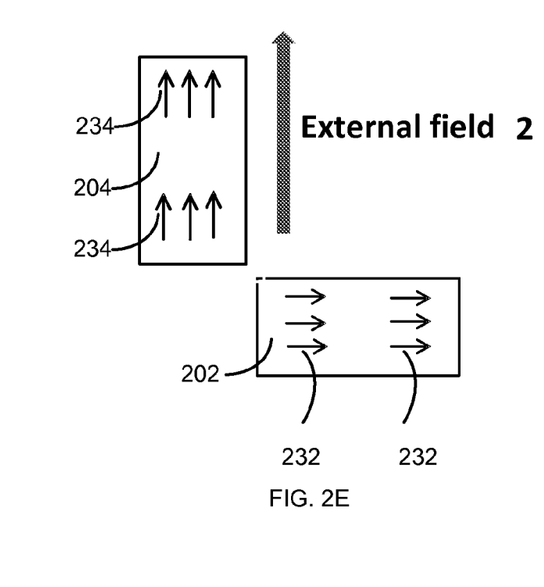
FIG. 2E shows magnetic orientation of permanent magnet of another one of the magnetic sensor element, after application of a magnetic field in the second direction, according to one aspect of the present disclosure.

Referring now to FIG. 2E, magnetic sensor element 202 with arrows 232 showing the magnetic orientation of permanent magnet 202' in a first direction is shown. Additionally, magnetic sensor element 204 with arrows 234 showing the magnetic orientation of permanent magnet 204' of magnetic sensor element 204 in a second direction is shown. As an example, alternating layers of FM2 and AFM2 films are deposited to form the permanent magnet 204' of magnetic sensor element 204. The blocking temperature of the AFM layer of permanent magnet 204' of magnetic sensor element 204 is Tb, which is less than the blocking temperature Ta of AFM layer of permanent magnet 202' of magnetic sensor element 202.

A second external magnetic field (External field 2) is applied in the desired direction of orientation for the permanent magnet 204' of magnetic sensor element 204, after raising the temperature of the films above the blocking temperature Tb for the AFM2 layer of permanent magnet 204' of magnetic sensor element 204, but below the blocking temperature Ta for the AFM1 layer of permanent magnet 202' of the magnetic sensor element 202. After application of the second external magnetic field, the temperature is lowered below the blocking temperature Tb. Now, the permanent magnet 204' of magnetic sensor element 204 is magnetized in a second direction that corresponds to the direction of the applied magnetic field. In one example, the magnetic orientation of permanent magnet 204' of magnetic sensor element 204 corresponds to y axis.

As one skilled in the art appreciates, as the blocking temperature Ta of the AFM1 layer of permanent magnet 202' of magnetic sensor element 202 is higher than the blocking temperature Tb of the AFM2 layer of permanent magnet 204' of magnetic sensor element 204, the magnetic orientation of the permanent magnet 202' of magnetic sensor element 202 remains in the first direction, even though the permanent magnet 202' of magnetic sensor element 202 may be exposed to the applied second magnetic field in the second direction.

An example AFM1 222 layer material for the permanent magnet 202' of magnetic sensor element 202 may be nickel manganese (NiMn) based alloy, which has a blocking temperature Tblock of about 350 degree centigrade. An example AFM2 226 layer material for the permanent magnet 204' of magnetic sensor element 204 may be ferromanganese (FeMn) based alloy, which has a blocking temperature Tblock of about 170 degree centigrade. As an example, permanent magnet 202' of magnetic sensor element 202 with NiMn AFM1 layer may be magnetized in a first direction, by raising the temperature of the FM1/AFM1 layer higher than 350 degree centigrade and applying the magnetic field in the first direction. Permanent magnet 204' of magnetic sensor element 204 with FeMn AFM2 layer may be magnetized in a second direction, by raising the temperature of the FM2/AFM2 layer higher than blocking temperature Tb, but lower than blocking temperature Ta and applying the magnetic field in the second direction. For example, by raising the temperature of the magnetic film stack to about 250 degree centigrade.

Figure 2F:
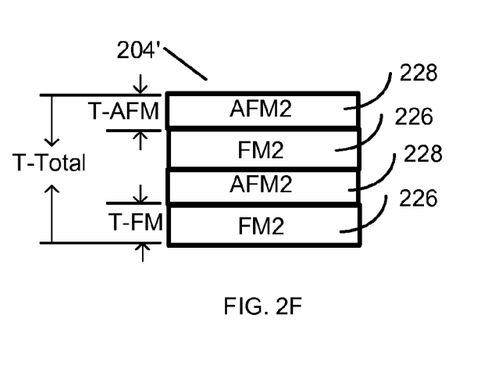
FIG. 2F shows another example construction of a permanent magnet of FIG. 2C, with a plurality of alternating layers of FM and AFM layers, according to one aspect of the present disclosure.

In one example, a plurality of alternating layers of FM and AFM layers may be formed. For example, each AFM and FM layer thickness may be in the range of 10 Angstroms to 1000 Angstroms. In some examples, the total thickness of the alternating AFM and FM layer may be in the range of about 0.1 micrometer to about 1.5 micrometers. For example, FIG. 2F shows permanent magnet 204' of magnetic sensor element 204 (previously described with reference to FIG. 2C) with a plurality of alternating ferromagnetic layer FM2 226 and antiferromagnetic layer AFM2 228. In this example, two alternating layers of FM and AFM layers are shown, with each AFM layer thickness shown as T-AFM, each FM layer thickness shown as T-FM and total thickness of alternating AFM and FM layer shown as T-Total. For example, thickness T-AFM and T-FM may be in the range of 10 Angstroms to 1000 Angstroms. Thickness T-Total may be in the range of about 0.1 micrometer to about 1.5 micrometers.

Figure 3:
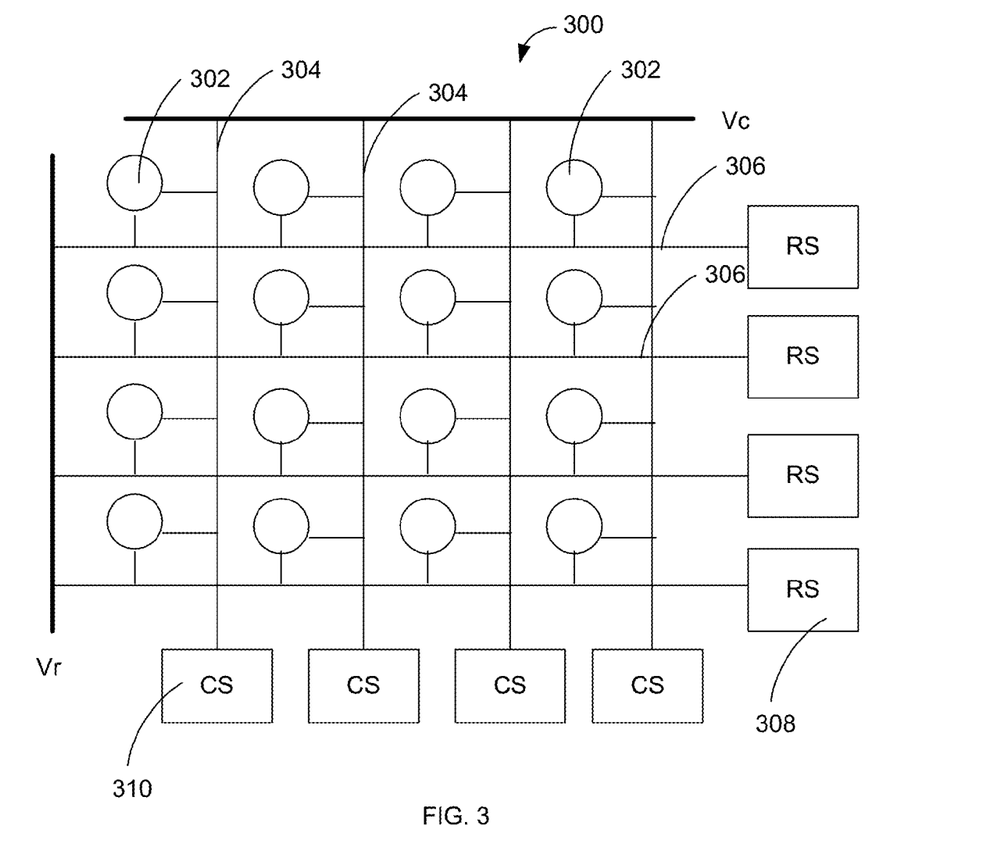
FIG. 3 shows an example memory, with a magnetic storage array, according to one aspect of the present disclosure.

Now, referring to FIG. 3, an example memory 124 of this disclosure will be described. In one example, the memory 124 includes a magnetic storage array 300, with a plurality of magnetic storage elements 302. The magnetic storage elements 302 may be configured as magnetic tunnel junction (MTJ) elements. A plurality of row Conductors 304 and column conductors 306 are provided. A pair of row conductor 304 and a column conductor 306 are configured to operatively couple to one of the magnetic storage element 502. Each row conductor 304 is coupled to a row switching element 308 at one end and to a row supply voltage Vr at the other end. Each column conductor 306 is coupled to a column switching element 310 at one end and to a column supply voltage Vc at the other end. In some examples, row supply voltage Vr and column supply voltage Vc may be same. In some examples, row switching element 308 and column switching element 310 may be a transistor. As one skilled in the art appreciates, selectively turning on a row switching element 308 and a column switching element 310, one of the magnetic storage element 502 will be coupled to the corresponding row conductor 304 and column conductor 306.

Figure 3A:
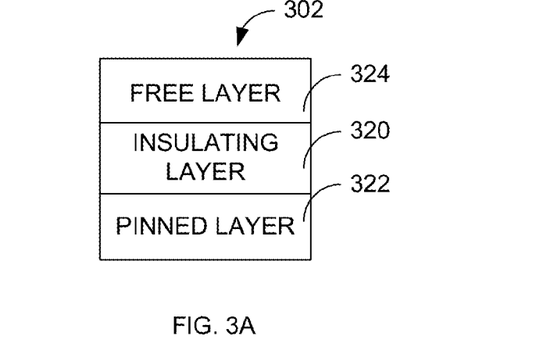
FIG. 3A shows an example magnetic storage element of the magnetic storage array, according to one aspect of the present disclosure.

Now, referring to FIG. 3A, an example MTJ element 330 is described. In one example, magnetic storage element 302, is configured as a MTJ element 330. The MTJ element is formed by two magnetic layers separated by a thin insulating layer 320. One of the magnetic layer is referred to as a pinned layer 322 and another magnetic layer is referred to as a free layer 324. The pinned layer 322 is oriented in a predefined direction, to create a permanent magnet. In one example, the pinned layer 322 may include an alternating FM and AFM layer. As one skilled in the art appreciates, the FM layer of the pinned layer 322 interfaces with the insulating layer 320.

The free layer 324 may be selectively oriented in the same direction as the pinned layer 322 or oriented in a direction opposite to the pinned layer 322. When the free layer 324 is oriented in the same direction as the pinned layer 322, the resistance of the MTJ element will be lower than when the free layer 324 is oriented in the opposite direction as the pinned layer 322. This difference in the resistance of the MTJ element may be advantageously used to indicate two states of a bit, thereby yielding a binary storage element. In one example, as previously described, a switching element, like a transistor may be coupled in series with the MTJ element to determine the state of a stored bit, based on the resistance of the MTJ. Sometimes these MTJ storage elements are referred to as magnetoresistive or MR storage elements.

Switching of the orientation of the free layer 324 may be performed using different methods. In some examples, an external magnetic field is applied to the free layer 324 to change the orientation direction of the free layer 324 from one orientation to another orientation. In this example, the pinned layer 322 is constructed such that the orientation of the pinned layer 322 is not altered by the application of external magnetic field to the free layer 324. Further, the orientation of the pinned layer 322 and free layer 324 are stable at room temperature. These types of MTJ elements are sometimes referred to as magnetic field switched MTJ and an array of such MTJs referred to as a magnetic field switched MRAMs.

In some examples, switching the orientation direction of the free layer 324 is performed by using a spin polarized current flowing through the MTJ, instead of using a magnetic field. These types of MTJ arrays are sometimes referred to as STTMRAM, where STT stands for spin transfer torque. Sometimes, these types of MTJ arrays may also be referred to as spin transfer switched MRAMs.

In yet another example, switching the orientation direction of the free layer 324 is performed using thermal assist. In this example, the MTJ is briefly heated prior to switching the orientation of the free layer 324. For example, the switching of the orientation of the free layer 324 may be performed by applying an external magnetic field. After the orientation of the free layer 324 is switched, the applied heat is removed. In this example, the pinned layer 322 is constructed such that the orientation of the pinned layer 322 is not altered by the application of heat or external magnetic field to the free layer 324. Further, the orientation of the pinned layer 322 and free layer 324 are stable at room temperature.

Figure 3B:
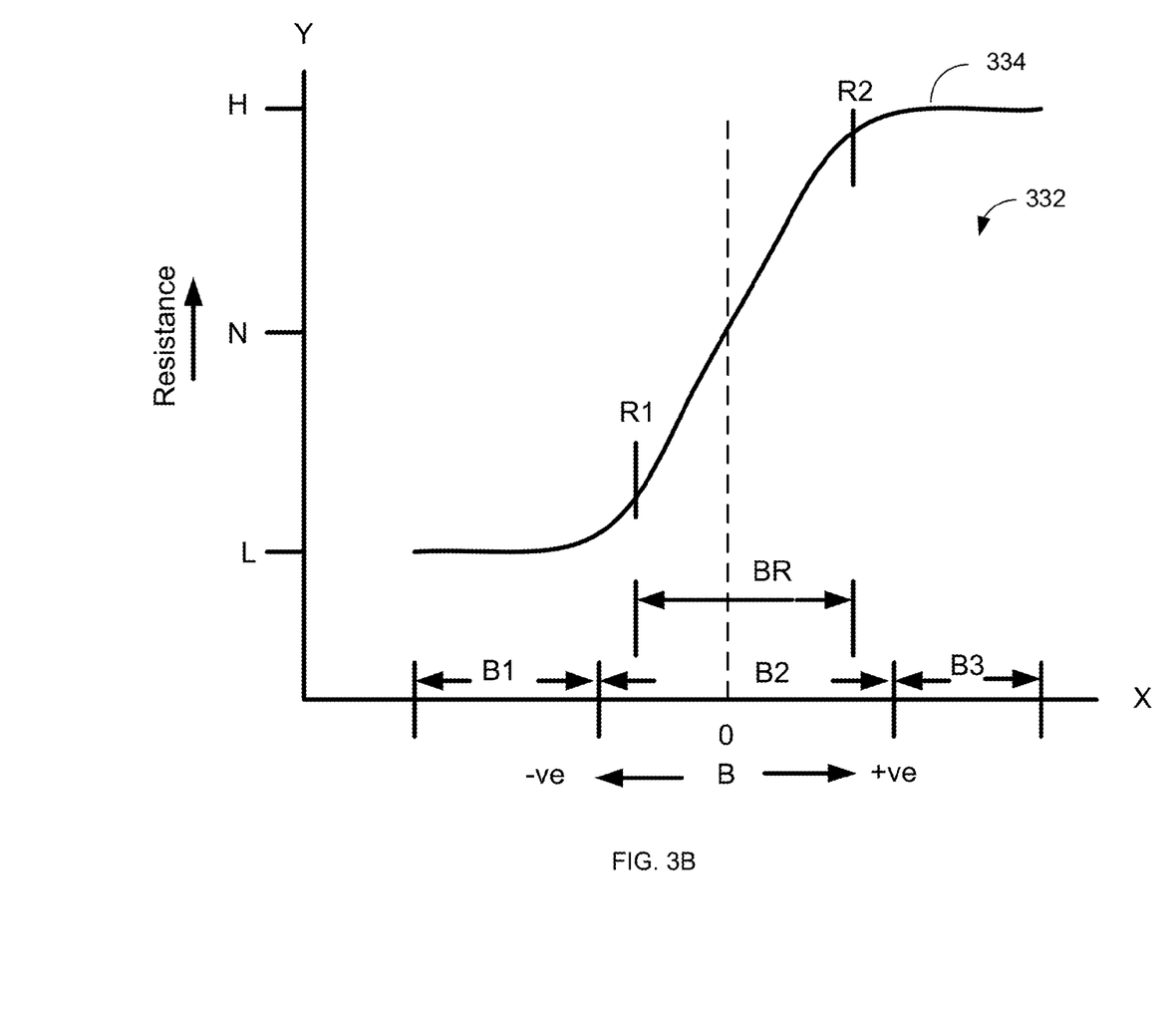
FIG. 3B shows a graph describing the relationship of change of resistance of an magnetic tunnel junction element, based on an applied magnetic field, according to one aspect of the present disclosure.

Now, referring to FIG. 3B, an example configuration and operation of an MTJ element 330 as a magnetic sensor element is described. FIG. 3B shows a graph 332 describing the relationship of change of resistance of an MTJ element 330, based on an applied magnetic field B. In graph 332, X axis represents the applied magnetic field B. Y axis shows corresponding resistance R. Line 334 shows the resistance of the MTJ element based on the applied magnetic field B. Depending upon the orientation of the magnetic field, the applied magnetic field is shown as either positive or negative about the point 0 on the X axis. For example, when the applied magnetic field B is 0, the resistance of the MTJ element is N ohms. When the applied magnetic field in positive and is in the range B3, the resistance of the MTJ element is substantially constant at a value of H ohms. When the applied magnetic field is negative and in the range of B1, the resistance of the MTJ element is substantially constant at a value of L ohms. When the applied magnetic field is in the range of B2, the resistance of the MTJ element varies from a low resistance of L ohms to a high resistance of H ohms.

As one skilled in the art appreciates, the MTJ element 330 in some examples may be configured to act as a magnetic sensor element to sense applied magnetic field in an operating range of BR, where the resistance of the MTJ elements varies based on the applied magnetic field, for example, in the R1-R2 portion of line 334. In some examples, magnetic sensor elements 202, 204, 206 and 208 described with reference to FIG. 2 may alternatively be configured as MTJ elements to sense applied magnetic field. In some examples, the MTJ elements configured as magnetic sensor elements may be magnetic field switched MTJs.

In some examples, the MTJ element 330 may be configured to act as a magnetic storage element, as previously described with reference to FIG. 3A. For example, in some examples, by applying a magnetic field in the range of B1 to store a first state and applying a magnetic field in the range of B2 to store a second state. As previously described, if the orientation of the free layer is substantially same as the pinned layer, the resistance of the MTJ element will be low. This low resistance state may be used to indicate one of the states, for example, the first state. Similarly, if the orientation of the free layer is substantially opposite to the pinned later, the resistance of the MTJ element will be high. This high resistance state may be used to indicate one of the states, for example, the second state.

As one skilled in the art appreciates, the magnetic sensor 126 and magnetic storage element 124 both have magnetic layers that are formed during their construction. Further, one or more layers of the magnetic sensor 126 and magnetic storage element 124 have permanent magnets oriented in a specific direction. In some examples, the magnetic sensor elements and magnetic storage elements may be MTJ elements. It may be advantageous to construct both the magnetic sensor 126 and magnetic storage element 124 in a composite ASIC 116. An example composite ASIC 116 is further described with reference to FIG. 6.

Figure 4:
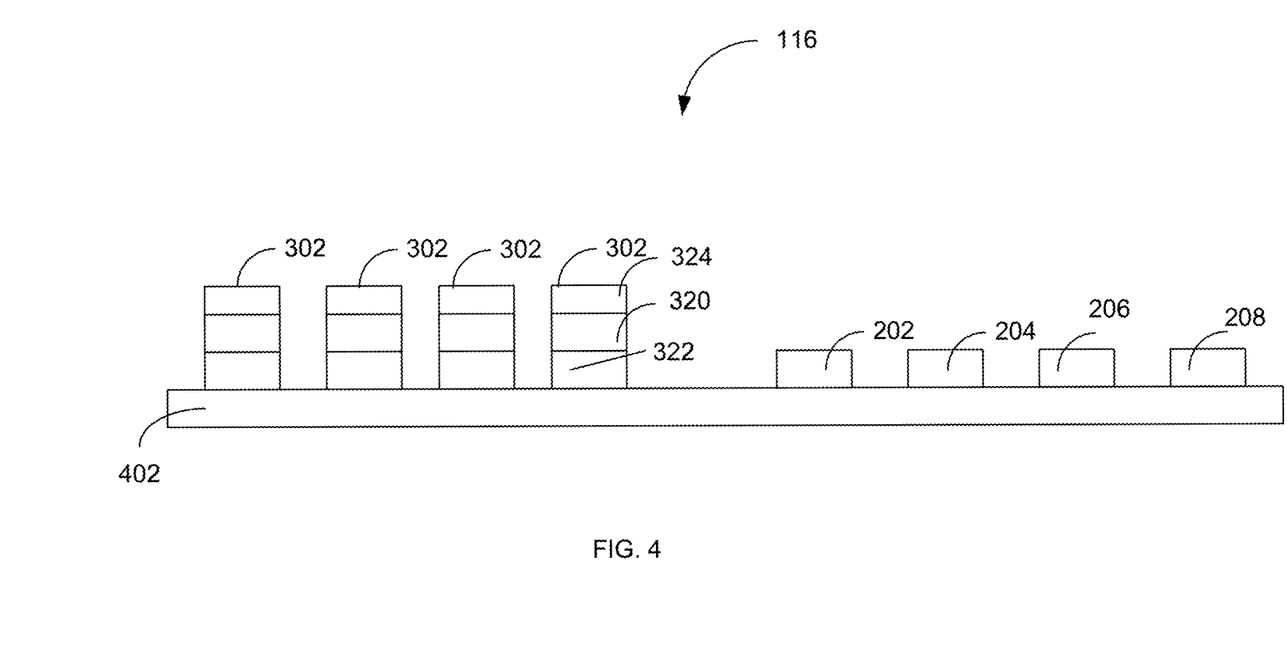
FIG. 4 shows an example construction of the magnetic sensor elements and magnetic storage elements on an integrated circuit substrate, according to one aspect of the present disclosure.

FIG. 4 shows an example composite ASIC 116. The composite ASIC 116 includes an integrated circuit substrate 402. Integrated circuit substrate 402 may be a silicon substrate, which may be used to form one or more electronic circuits using for example, CMOS technology. In one example, the magnetic sensor 126 and memory 124 are formed on the integrated circuit substrate 402. For example, magnetic storage elements 302 of memory 124 are formed on the integrated circuit substrate 402. Additionally, magnetic sensor elements 202, 204, 206 and 208 of magnetic sensor 126 may be formed on integrated circuit substrate 402 as well. The construction of magnetic storage element 302 may be similar to as described with reference to FIGS. 3 and 3A. Construction of magnetic sensor elements 202, 204, 206 and 208 may be similar to as described with reference to FIGS. 2, 2A, 2B, 2C, 2D, 2E and 3B.

As one skilled in the art appreciates, in one example, the pinned layer 322 of magnetic storage element 302 may be constructed similar to permanent magnets of one of the magnetic sensor elements 202 or 204, as previously described. In one example, the pinned layer 322 may include an alternating FM layer and AFM layer. In one example, the pinned layer 322 may be similar to the permanent magnet 202' of magnetic sensor element 202, with alternating FM1 layer and AFM1 layer. So, when the permanent magnet 202' of magnetic element 202 is formed, the pinned layer 322 of the magnetic storage element 302 may also be formed. In this example, the orientation of the pinned layer 322 of magnetic storage element 302 will correspond to the orientation of the permanent magnet 202' of magnetic sensor element 202. When the permanent magnet 204' of magnetic element 204 is formed, due to a lower blocking temperature for AFM2 layer, the magnetic orientation of pinned layer 322 of the magnetic storage element 302 is not affected.

In one example, the free layer 324 of magnetic storage element 302 may include alternating FM layer and AFM layer. In some examples, the AFM layer of the free layer 324 may be chosen such that a blocking temperature of the AFM layer is less than the blocking temperature of both AFM1 layer and AFM2 layer.

Figure 4A:
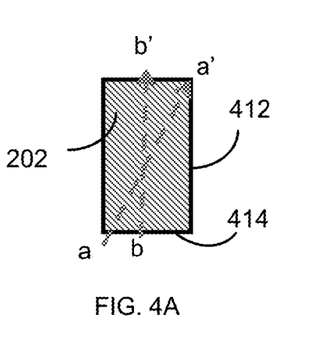
FIGS. 4A, 4C and 4D shows alternate shapes of the permanent magnet, according to one aspect of the present disclosure.

Now referring to FIG. 4A, an exemplary magnetic sensor element 202 deposited in a stripe shape is shown. For example, the magnetic sensor element 202 has a long side 412 and a short side 414. Aspect ratio Ar of the film is defined by the length of the long side 412 as compared to the width of the short side 414. For example, an aspect ratio Ar of 1:1 indicates a square form, where the length of the long side 412 is same as the width of the short side 414. Similarly, an aspect ratio Ar of 1:10 indicates a narrow rectangle form, where the length of the long side 412 is ten times longer than the width of the short side 414.

When a magnetic field is applied in the first direction, magnetization preferably occurs along an axis that corresponds to an elongated portion the deposited film. This phenomenon is known as shape anisotropy. For example, for the long stripe form shown, magnetization may occur along an axis a-a', which is the longest possible distance, in the long stripe form. However, preferred magnetization direction for the long stripe form is along an axis b-b'. As one skilled in the art appreciates, the preferred axis b-b' runs substantially parallel to the long side of the stripe form.

One way to achieve magnetization in a direction substantially parallel to the long side of the stripe form is to have a high aspect ratio for the deposited film, for example, an aspect ratio Ar in the range of 1:10 or higher. However, when a high aspect ratio stripe pattern is used, for example, aspect ratio of about 1:10 or higher, the coercivity Hc of the magnetic film increases.

Figure 4B:
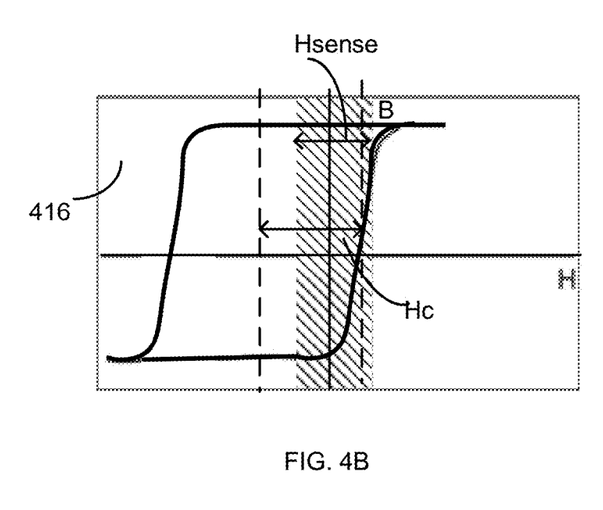
FIG. 4B shows an example B-H curve for a magnetic film with high aspect ratio, according to one aspect of the present disclosure.

For example, referring to FIG. 4B, an exemplary B-H curve 416 for a magnetic film with high aspect ratio Ar is shown. The coercivity (Hc) of the magnetic film in this example is significantly higher. High aspect ratio Ar of the film in this example causes an increase in coercivity. With increase in coercivity, we can no longer maintain desired magnetic field within full sensing magnetic field range (Hsense), as the hysteresis loop for the magnetic film overlaps with the full magnetic field range.

In some embodiments, it may be preferable to have a magnetic strip that forms the permanent magnet of magnetic sensor element, for example, permanent magnets of magnetic sensor elements 202, 204, 206 and 208 with a long side and a short side with a shaped short side. The short side may be shaped such that the longest distance along the long side is substantially along the center of the magnetic stripe form. Example magnetic stripe form with such a construction is shown in FIG. 4C and FIG. 4D.

Figure 4C:
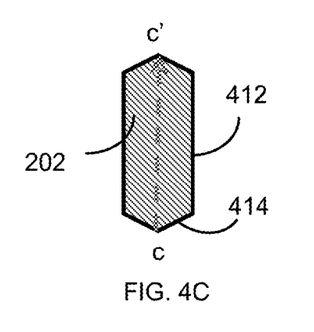

Referring to FIG. 4C, a permanent magnet, for example, permanent magnet 202' of magnetic sensor element 202 has a long side 412. The short side 414 has a shape of an isosceles triangle. The longest distance along the long side is substantially along the center of the magnetic stripe form, for example, along the axis c-c', passing through the vertex of the isosceles triangle. As previously discussed, when a magnetic field is applied to the permanent magnet of magnetic sensor element 202 in a direction substantially along the axis c-c', the magnetic orientation of the permanent magnet will be substantially along the axis c-c'.

Figure 4D:
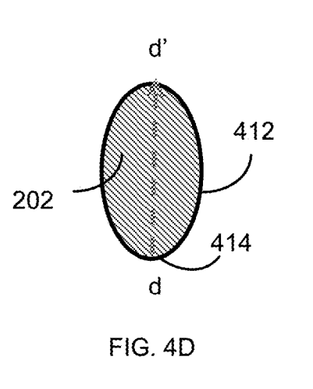

Now, referring to FIG. 4D, a permanent magnet, for example, permanent magnet 202' of magnetic sensor element 202 has a long side 412 and a short side 414. In this example, the short side 414 has a shape of a symmetric convex parabola. The longest distance along the long side is substantially along the center of the magnetic stripe form, for example, along the axis d-d'. As previously discussed, when a magnetic field is applied to the permanent magnet 202' of magnetic sensor element 202 in a direction substantially along the axis d-d', the magnetic orientation of the permanent magnet 202' of magnetic element 202 will be substantially along the axis d-d'.

As one skilled in the art appreciates, using shape anisotropy, any possible misalignment or offset in the magnetization direction may be minimized, when the permanent magnets of magnetic sensor elements 202, 204, 206 and 208 are formed. Magnetic storage elements 302 may also be similarly constructed, with shape anisotropy.

Further, using an alternating layer of FM/AFM layers, for example, as described with reference to FIGS. 2B and 2C permits use of magnetic strip pattern with smaller aspect ratio Ar, for example, aspect ratio Ar in the range of about 1:1 to about 1:5.

Figure 5:
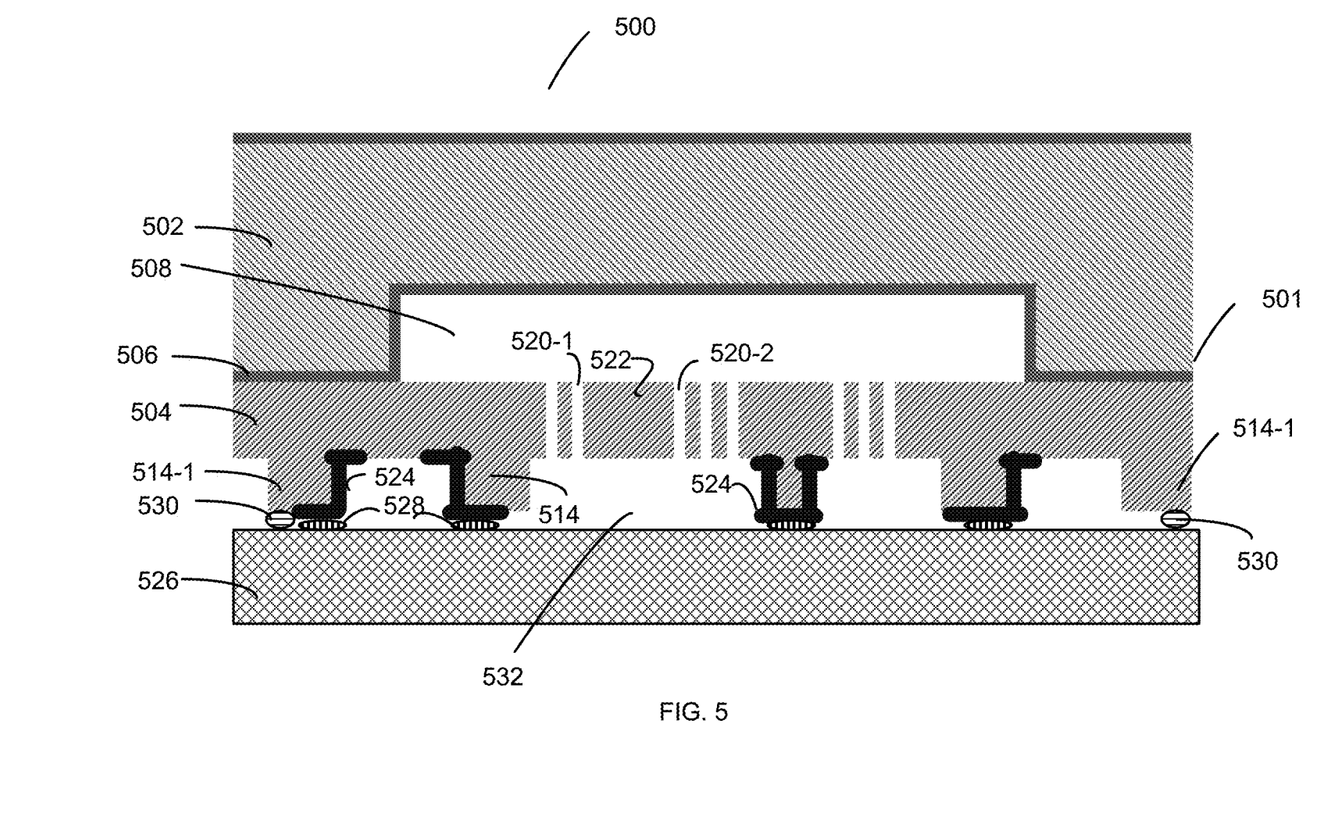
FIG. 5 shows a cross-section of example MEMS device, according to one aspect of the present disclosure.

Now, referring to FIG. 5 an exemplary MEMS device 500 is described. MEMS device 500 includes a MEMS substrate 501 and integrated circuit substrate 526. MEMS substrate 501 includes a handle layer 502 and a device layer 504. A fusion bond layer 506 bonds the handle layer 502 to device layer 504, to form an upper cavity 508, defined by the lower side 510 of the handle layer 502 and upper side 512 of the device layer 504.

Now referring to device layer 504, a plurality of standoff 514 structures are formed on the device layer 504, for example, by deep reactive ion etching (DRIE) process. FIG. 5 further shows trench patterns 520-1 and 520-2, an actuator 522, device pads 524, integrated circuit substrate 526, IC pads 528 and seal ring 530. Seal ring 530 in some examples may be a conductive metal seal. A movable actuator 522 is created by forming a plurality of trench patterns 520-1 and 520-2 on the device layer 504, for example, using a DRIE process. Actuator 522 may be configured as a sensor, for example, to measure acceleration, angular rotation and the likes. Next, device pads 524, preferably made of germanium alloys are deposited and patterned on the device layer 504.

Integrated circuit substrate 526 includes one or more electronic circuits that communicate with various sensors formed on the device layer 504. Integrated circuit substrate 526 may also include the memory 124 and magnetic sensor 126. In some examples, processor 112 and bus 118 may also be formed on the integrated circuit substrate 526. IC pads 528, preferably made of aluminum alloys are deposited and patterned on the integrated circuit substrate 526. IC pads 528 are coupled to device pads 524 to provide a communication path to various sensors formed on the device layer 504. For example, device pads 524 may be conductively bonded with IC pads 528.

Standoff 514-1 surrounds various devices formed on the device layer 504. A seal ring 530 is formed on the standoff 514-1 to bond the device layer 504 with integrated circuit substrate 526, for example, to hermetically seal various devices formed on the device layer 504. Height of the standoff 514-1, along with seal ring 530 define height of the lower cavity 532.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A device, comprising:
   an integrated circuit substrate;
   a magnetic sensor with at least one magnetic sensor element, the magnetic sensor element including a permanent magnet, the magnetic sensor disposed over the integrated circuit substrate; and
   a plurality of magnetic storage elements, each with at least one permanent magnet, the plurality of magnetic storage elements disposed over the integrated circuit substrate,
   wherein the magnetic sensor includes at least a pair of magnetic sensor elements, an orientation of the permanent magnet of one of the magnetic sensor element is orthogonal to an orientation of the permanent magnet of the other one of the magnetic sensor element;
   wherein the permanent magnets of the magnetic sensor elements include at least a pair of ferromagnetic (FM) layer and antiferromagnetic (AFM) layer, wherein a blocking temperature of the AFM layer of one of the magnetic sensor element is higher than a blocking temperature of the AFM layer of the other one of the magnetic sensor element; and
   wherein all of the permanent magnets having a plurality of alternating layers of FM layer and AFM layer, wherein each of the FM layer and the AFM layer has a thickness between about 10 angstroms and about 1000 angstroms.

2. The device of claim 1, wherein total thickness of the alternating layers of FM layer and AFM layer is between about 0.1 micrometer and about 1.5 micrometer.

3. The device of claim 1, wherein the magnetic storage element includes a pinned layer, an insulating layer and a free layer, wherein the pinned layer is configured as the permanent magnet with a fixed orientation and the free layer is configured to be switched between a first orientation and a second orientation.

4. The device of claim 3, wherein an external magnetic field is applied to selectively switch the orientation of the free layer.

5. The device of claim 4, wherein the free layer is selectively heated before application of the external magnetic field.

6. The device of claim 3, wherein a spin polarized current is passed through the magnetic storage element to selectively switch the orientation of the free layer.

7. The device of claim 3, wherein the pinned layer of the plurality of magnetic storage elements are formed with an orientation that is substantially same as the orientation of at least one of the permanent magnet of the magnetic sensor element.

8. The device of claim 3, wherein at least one of the magnetic sensor element includes a pinned layer, an insulating layer and a free layer, wherein the pinned layer is configured as the permanent magnet with a fixed orientation and the free layer is configured such that a resistance of the magnetic sensor element varies when an external magnetic field is applied to the magnetic sensor element.

9. The device of claim 8, wherein a change in the resistance of the magnetic sensor element is indicative of the direction of the applied magnetic field.

10. The device of claim 1, wherein one of the permanent magnet of the magnetic sensor element is magnetized in a first direction by applying an external magnetic field in the first direction, at a temperature greater than higher blocking temperature.

11. The device of claim 10, wherein another one of the permanent magnet of the magnetic element is magnetized in a second direction by applying another external magnetic field in the second direction, at a temperature greater than the lower blocking temperature of the AFM layer with lower blocking temperature, but less than the blocking temperature of the AFM layer with higher blocking temperature.

12. The device of claim 11, wherein the permanent magnets are formed in a stripe pattern with a long side and a short side, a ratio of a width to a length of the stripe pattern define an aspect ratio, wherein the aspect ratio is in the range of 1:1 to 1:5.

13. The device of claim 12, wherein the short side is shaped such that the longest distance along the long side is substantially along the center of the stripe pattern.

14. The device of claim 12, wherein the short side has a shape of a symmetric convex parabola.

15. The device of claim 12, wherein the short side has a shape of an isosceles triangle.

16. A device, comprising:
    an integrated circuit substrate;
    a magnetic sensor with at least one magnetic sensor element, the magnetic sensor element including a permanent magnet, the magnetic sensor disposed over the integrated circuit substrate; and a plurality of magnetic storage elements, each with at least one permanent magnet, the plurality of magnetic storage elements disposed over the integrated circuit substrate, wherein the magnetic sensor includes at least a pair of magnetic sensor elements, an orientation of the permanent magnet of one of the magnetic sensor element is orthogonal to an orientation of the permanent magnet of the other one of the magnetic sensor element;

wherein the permanent magnets of the magnetic sensor elements include at least a pair of ferromagnetic (FM) layer and antiferromagnetic (AFM) layer, wherein a blocking temperature of the AFM layer of one of the magnetic sensor element is higher than a blocking temperature of the AFM layer of the other one of the magnetic sensor element;

wherein one of the permanent magnet of the magnetic sensor element is magnetized in a first direction by applying an external magnetic field in the first direction, at a temperature greater than higher blocking temperature;

wherein another one of the permanent magnet of the magnetic element is magnetized in a second direction by applying another external magnetic field in the second direction, at a temperature greater than the lower blocking temperature of the AFM layer with lower blocking temperature, but less than the blocking temperature of the AFM layer with higher blocking temperature; and wherein a magnetic concentrator is disposed over the pair of magnetic sensor elements so as to bend a magnetic field applied orthogonal to the orientation of the permanent magnets of the pair of magnetic sensor elements; and the pair of magnetic sensor elements are configured to measure the strength of the magnetic field applied orthogonal to the orientation of the permanent magnets of the pair of magnetic sensor elements.

17. The device of claim 16, wherein the magnetic storage element includes a pinned layer, an insulating layer and a free layer, wherein the pinned layer is configured as the permanent magnet with a fixed orientation and the free layer is configured to be switched between a first orientation and a second orientation.

18. The device of claim 17, wherein an external magnetic field is applied to selectively switch the orientation of the free layer.

19. The device of claim 18, wherein the free layer is selectively heated before application of the external magnetic field.

20. The device of claim 17, wherein a spin polarized current is passed through the magnetic storage element to selectively switch the orientation of the free layer.

21. The device of claim 17, wherein the pinned layer of the plurality of magnetic storage elements are formed with an orientation that is substantially same as the orientation of at least one of the permanent magnet of the magnetic sensor element.

22. The device of claim 17, wherein at least one of the magnetic sensor element includes a pinned layer, an insulating layer and a free layer, wherein the pinned layer is configured as the permanent magnet with a fixed orientation and the free layer is configured such that a resistance of the magnetic sensor element varies when an external magnetic field is applied to the magnetic sensor element.

23. The device of claim 22, wherein a change in the resistance of the magnetic sensor element is indicative of the direction of the applied magnetic field.

24. The device of claim 16, wherein the permanent magnets are formed in a stripe pattern with a long side and a short side, a ratio of a width to a length of the stripe pattern define an aspect ratio, wherein the aspect ratio is in the range of 1:1 to 1:5.

25. The device of claim 24, wherein the short side is shaped such that the longest distance along the long side is substantially along the center of the stripe pattern.

26. The device of claim 24, wherein the short side has a shape of a symmetric convex parabola.

27. The device of claim 24, wherein the short side has a shape of an isosceles triangle.

28. The device of claim 16, wherein all of the permanent magnets having a plurality of alternating layers of FM layer and AFM layer, wherein each of the FM layer and the AFM layer has a thickness between about 10 angstroms and about 1000 angstroms.

29. The device of claim 28, wherein total thickness of the alternating layers of FM layer and AFM layer is between about 0.1 micrometer and about 1.5 micrometer.

30. A device, comprising:
an integrated circuit substrate;
a magnetic sensor with at least one magnetic sensor element, the magnetic sensor element including a permanent magnet, the magnetic sensor disposed over the integrated circuit substrate; and
a plurality of magnetic storage elements, each with at least one permanent magnet, the plurality of magnetic storage elements disposed over the integrated circuit substrate;
a MEMS substrate, the MEMS substrate including a handle layer and a device layer, wherein a sensor is formed on the device layer;
a plurality of IC pads disposed over the integrated circuit substrate; and
a plurality of device pads coupled to the sensor, wherein the plurality of device pads are selectively coupled to the plurality of IC pads so as to process signals generated by the sensor.

31. The device of claim 30, wherein the device layer is coupled to the integrated circuit substrate with a conductive metal seal so as to form a device cavity.

32. The device of claim 30, wherein the magnetic sensor includes at least a pair of magnetic sensor elements, an orientation of the permanent magnet of one of the magnetic sensor element is orthogonal to an orientation of the permanent magnet of the other one of the magnetic sensor element.

33. The device of claim 32, wherein the permanent magnets of the magnetic sensor elements include at least a pair of ferromagnetic (FM) layer and antiferromagnetic (AFM) layer, wherein a blocking temperature of the AFM layer of one of the magnetic sensor element is higher than a blocking temperature of the AFM layer of the other one of the magnetic sensor element.

34. The device of claim 33, wherein one of the permanent magnet of the magnetic sensor element is magnetized in a first direction by applying an external magnetic field in the first direction, at a temperature greater than higher blocking temperature.

35. The device of claim 34, wherein another one of the permanent magnet of the magnetic element is magnetized in a second direction by applying another external magnetic field in the second direction, at a temperature greater than the lower blocking temperature of the AFM layer with lower blocking temperature, but less than the blocking temperature of the AFM layer with higher blocking temperature.

36. The device of claim 35, wherein the permanent magnets are formed in a stripe pattern with a long side and a short side, a ratio of a width to a length of the stripe pattern define an aspect ratio, wherein the aspect ratio is in the range of 1:1 to 1:5.

37. The device of claim 36, wherein the short side is shaped such that the longest distance along the long side is substantially along the center of the stripe pattern.

38. The device of claim 33, wherein all of the permanent magnets having a plurality of alternating layers of FM layer and AFM layer, wherein each of the FM layer and the AFM layer has a thickness between about 10 angstroms and about 1000 angstroms.

39. The device of claim 38, wherein total thickness of the alternating layers of FM layer and AFM layer is between about 0.1 micrometer and about 1.5 micrometer.

40. The device of claim 36, wherein the short side has a shape of a symmetric convex parabola.

41. The device of claim 36, wherein the short side has a shape of an isosceles triangle.

42. The device of claim 30, wherein the magnetic storage element includes a pinned layer, an insulating layer and a free layer, wherein the pinned layer is configured as the permanent magnet with a fixed orientation and the free layer is configured to be switched between a first orientation and a second orientation.

43. The device of claim 42, wherein an external magnetic field is applied to selectively switch the orientation of the free layer.

44. The device of claim 43, wherein the free layer is selectively heated before application of the external magnetic field.

45. The device of claim 42, wherein a spin polarized current is passed through the magnetic storage element to selectively switch the orientation of the free layer.

46. The device of claim 42, wherein the pinned layer of the plurality of magnetic storage elements are formed with an orientation that is substantially same as the orientation of the permanent magnet of the magnetic sensor element.

47. The device of claim 46, wherein the permanent magnet of the magnetic sensor element and the pinned layer of the magnetic storage elements include a pair of ferromagnetic (FM) layer and antiferromagnetic (AFM) layer.

48. The device of claim 47, wherein all of the permanent magnets having a plurality of alternating layers of FM layer and AFM layer, wherein each of the FM layer and the AFM layer has a thickness between about 10 angstroms and about 1000 angstroms.

49. The device of claim 48, wherein total thickness of the alternating layers of FM layer and AFM layer is between about 0.1 micrometer and about 1.5 micrometer.

50. The device of claim 42, wherein the magnetic sensor element includes a pinned layer, an insulating layer and a free layer, wherein the pinned layer is configured as the permanent magnet with a fixed orientation and the free layer is configured such that a resistance of the magnetic sensor element varies when an external magnetic field is applied to the magnetic sensor element.

51. The device of claim 50, wherein a change in the resistance of the magnetic sensor element is indicative of the direction of the applied magnetic field.

\* \* \* \* \*